(12) United States Patent
Cabral, Jr. et al.

(10) Patent No.: US 7,384,868 B2
(45) Date of Patent: Jun. 10, 2008

(54) REDUCTION OF SILICIDE FORMATION TEMPERATURE ON SIGE CONTAINING SUBSTRATES

(75) Inventors: Cyril Cabral, Jr., Ossining, NY (US); Roy A. Carruthers, Stormville, NY (US); Jia Chen, Ossining, NY (US); Christophe Detavernier, Ossining, NY (US); James M. Harper, Durham, NH (US); Christian Lavoie, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 49 days.

(21) Appl. No.: 10/662,900

(22) Filed: Sep. 15, 2003

(65) Prior Publication Data

US 2005/0059242 A1  Mar. 17, 2005

(51) Int. Cl.
*H01L 21/44* (2006.01)
(52) U.S. Cl. .......... 438/682; 438/597; 438/683
(58) Field of Classification Search .......... 438/682, 438/683, 597
See application file for complete search history.

(56) References Cited

U.S. PATENT DOCUMENTS

| 5,952,094 A * | 9/1999 | Van Kesteren et al. .. 428/822.3 |
| 2002/0151170 A1* | 10/2002 | Maex et al. ............... 438/638 |
| 2004/0123922 A1* | 7/2004 | Cabral et al. ............... 148/527 |

* cited by examiner

*Primary Examiner*—Long Pham
(74) *Attorney, Agent, or Firm*—Scully, Scott, Murphy & Presser, P.C.; Robert M. Trepp, Esq.

(57) ABSTRACT

A method that solves the increased nucleation temperature that is exhibited during the formation of cobalt disilicides in the presence of Ge atoms is provided. The reduction in silicide formation temperature is achieved by first providing a structure including a Co layer including at least Ni, as an additive element, on top of a SiGe containing substrate. Next, the structure is subjected to a self-aligned silicide process which includes a first anneal, a selective etching step and a second anneal to form a solid solution of (Co, Ni) disilicide on the SiGe containing substrate. The Co layer including at least Ni can comprise an alloy layer of Co and Ni, a stack of Ni/Co or a stack of Co/Ni. A semiconductor structure including the solid solution of (Co, Ni) disilicide on the SiGe containing substrate is also provided.

18 Claims, 7 Drawing Sheets

Two Theta (degrees)

Temperature (°C)

FIG.3E (Prior Art)

Two Theta (degrees)

Temperature (°C)

REDUCTION OF SILICIDE FORMATION TEMPERATURE ON SIGE CONTAINING SUBSTRATES

FIELD OF THE INVENTION

The present invention relates to semiconductor device manufacturing, and more particularly to a method for reducing the formation temperature of cobalt disilicide on a silicon germanium (SiGe) containing substrate. The present invention also provides a semiconductor device comprising a SiGe containing substrate and a layer of (Co, Ni) $Si_2$ located thereon.

BACKGROUND OF THE INVENTION

In the semiconductor industry, silicides are generally used for contacting the semiconductor part of the transistor (i.e., the source/drain) and the poly-Si gate. In view of the requirement of low resistivity and low contact resistance, only three compounds selected from a list of possible metal silicide compounds are considered possible contact materials. The three best candidates are the C54-phase of titanium disilicide, cobalt disilicide and nickel monosilicide.

Problems with the nucleation of titanium disilicide in small dimensions prevent the use of titanium disilicide in advanced semiconductor devices. Hence, only cobalt disilicide and nickel monosilicide remain as viable candidates currently under consideration for contacting Si-based semiconductor substrates having narrow dimensions.

It is anticipated that SiGe or strained Si/SiGe may be used in the source/drain regions of advanced semiconductor devices in order to improve the electrical performance of the semiconductor device. Moreover, poly-SiGe can be used instead of the currently used poly-Si to contact the gate dielectric. Hence, there is an interest in finding a contact material for SiGe containing substrates.

It is known in the art that cobalt disilicide formation is delayed to higher temperatures in the presence of Ge atoms. The difficult nucleation of cobalt disilicide in the presence of Ge would greatly limit the choice of the contact material to only nickel monosilicide (either in its pure form, or in the presence of an alloying element) on SiGe containing substrates ("substrates" meaning either a single crystalline semiconductor in the source and drain regions, or a poly-SiGe layer on the gate of a device).

Because of the low resistivity and ease of formation, there would be a desire to provide cobalt disilicide contacts on SiGe containing substrates. In order for this to be a realization however, it is necessary to solve the problem of increased nucleation temperature which cobalt disilicide exhibits in the presence of Ge atoms.

Figure 1A:
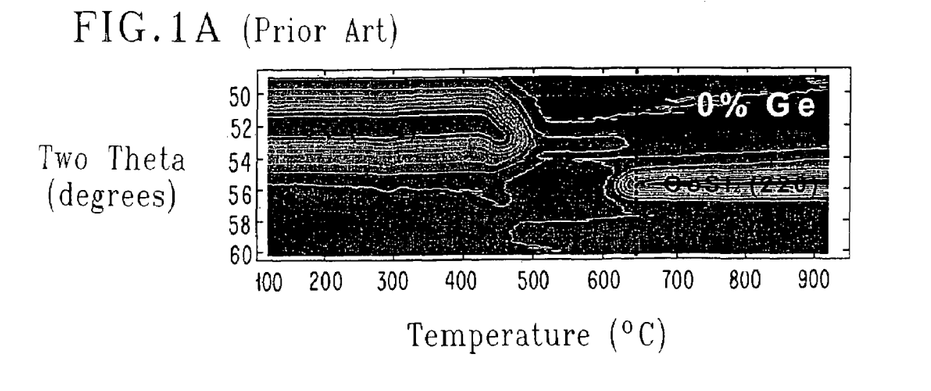
FIGS. 1A-1C are X-ray diffraction contour graphs of the prior art showing the $CoSi_2$ formation temperature for structures consisting of 20 nm TaN/8 nm Co containing 0%, 5% and 15% Ge/Si (100), respectively. The plots show x-ray diffraction angle (y-axis) vs. temperature (x-axis) with x-ray intensity indicated by the contour lines and gray scale.
Figure 1B:
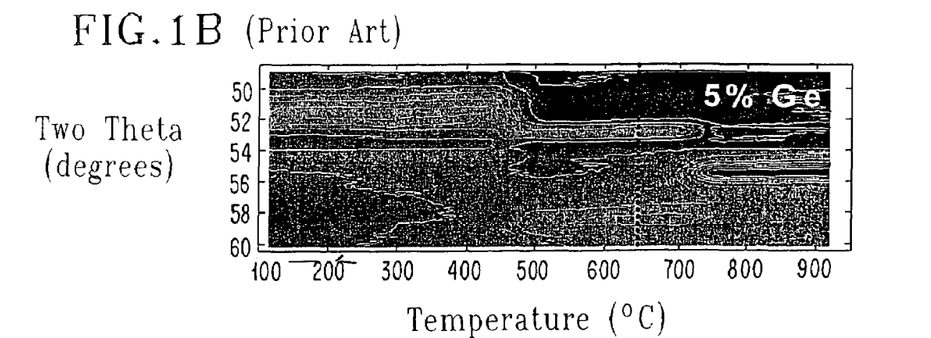
Figure 1C:
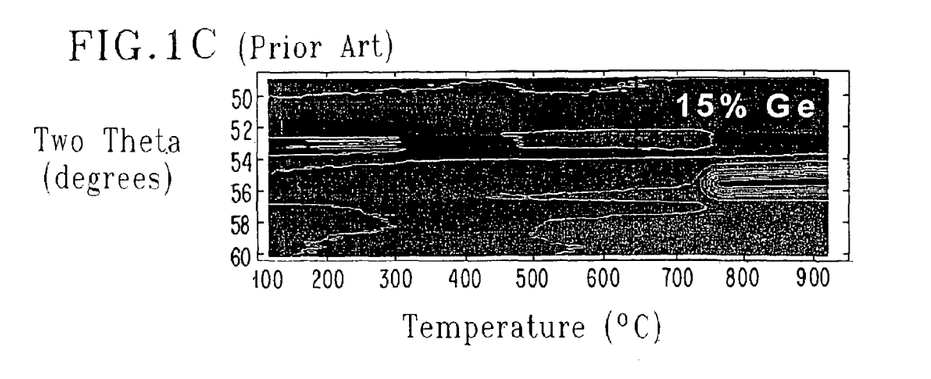

FIGS. 1A-1C illustrate the difficulty of forming cobalt disilicide in the metallurgical presence of Ge in the reaction region. The vertical dotted lines in each figure highlight the disilicide formation temperature. The samples of these figures comprised 20 nm TiN, as a barrier layer, 8 nm Co containing x % Ge (x is 0 for FIG. 1A, 5 for FIG. 1B and 15 for FIG. 1C) and Si (100). The cobalt disilicide was formed by annealing each of the samples using an annealing ramp rate of 3° C./secs in purified He. In FIGS. 1B and 1C, the Ge was intentionally added to the reaction by depositing a Co—Ge alloy. Higher cobalt disilicide formation temperatures are required as the amount of Ge in the reaction region increases.

Figure 2A:
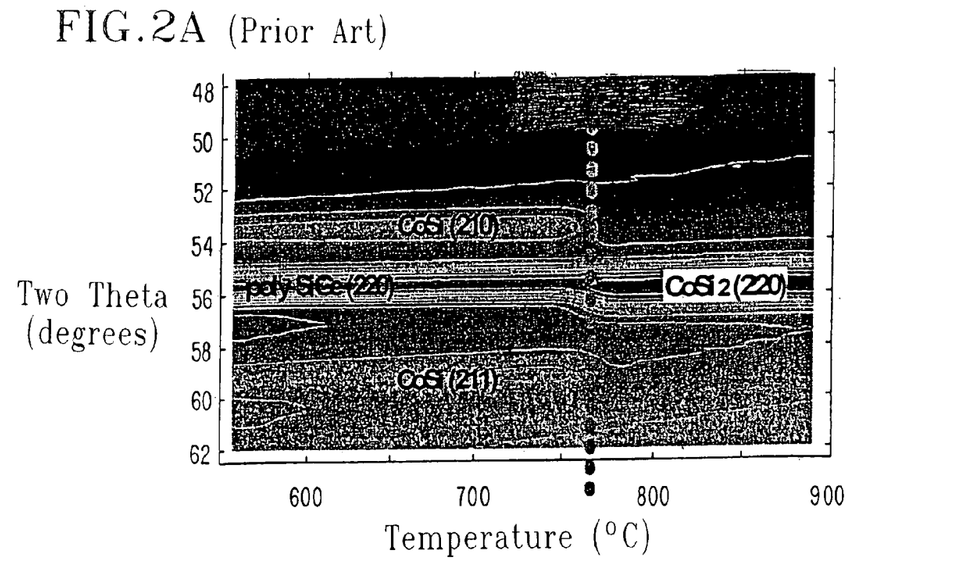
FIGS. 2A-2B are X-ray diffraction contour graphs of the prior art showing the $CoSi_2$ formation temperature on n and p-doped Ge containing poly-Si substrates.
Figure 2B:
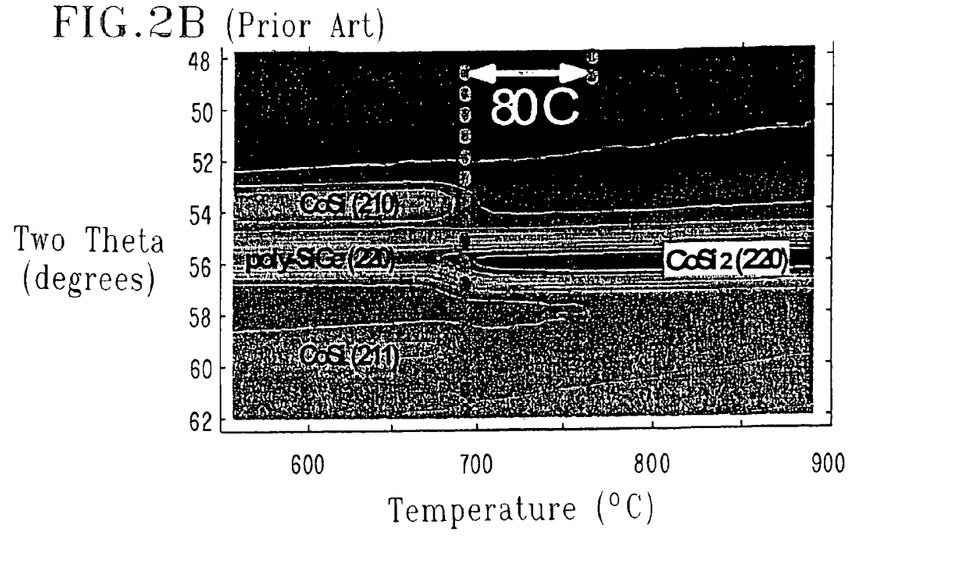

FIGS. 2A-2B illustrate the problem of forming cobalt disilicide on Ge containing poly-Si. The vertical dotted lines in each figure highlight the disilicide formation temperature. In FIG. 2A, n-doped poly-Si is employed, while in FIG. 2B p-doped poly-Si is employed. The disilicide formation temperature for the n-doped material is about 770° C. and for the p-doped material is 690° C. Especially, for n-doped poly-Si, the formation temperature is too high for standard processing recipes to work.

Figure 3A:
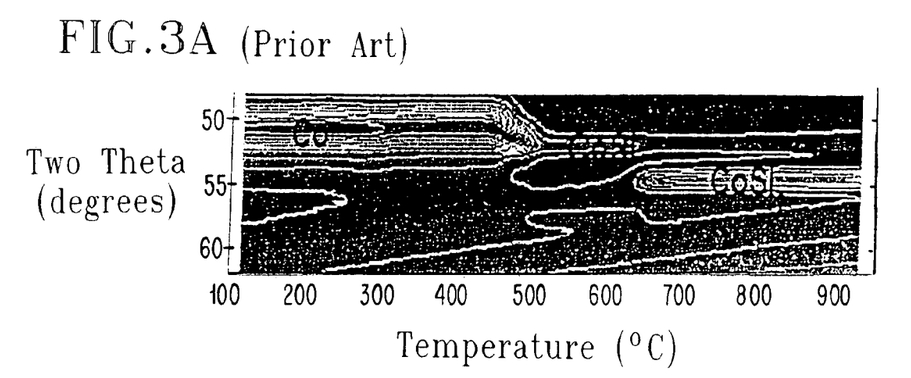
FIGS. 3A-3E are X-ray diffraction contour graphs of the prior art showing the $CoSi_2$ formation temperature on Ge containing poly-Si substrates. The Ge content of the poly-Si ranges from 0 to 40 atomic %.
Figure 3B:
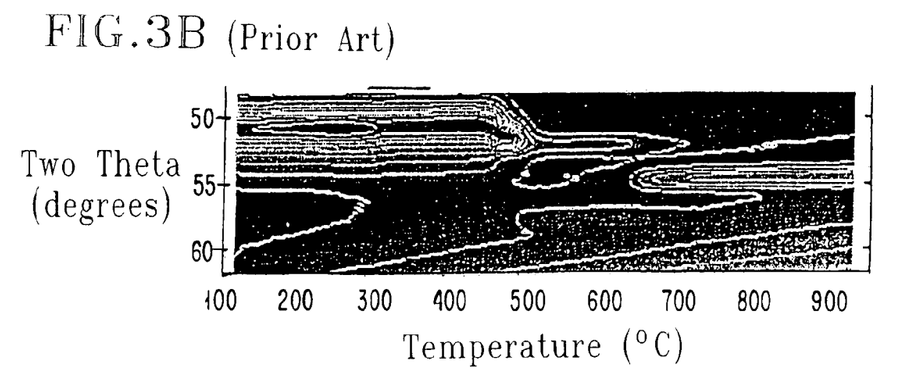
Figure 3C:
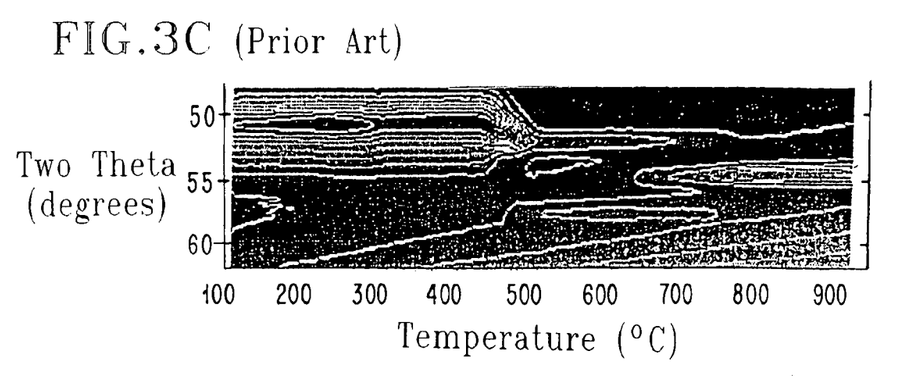
Figure 3D:
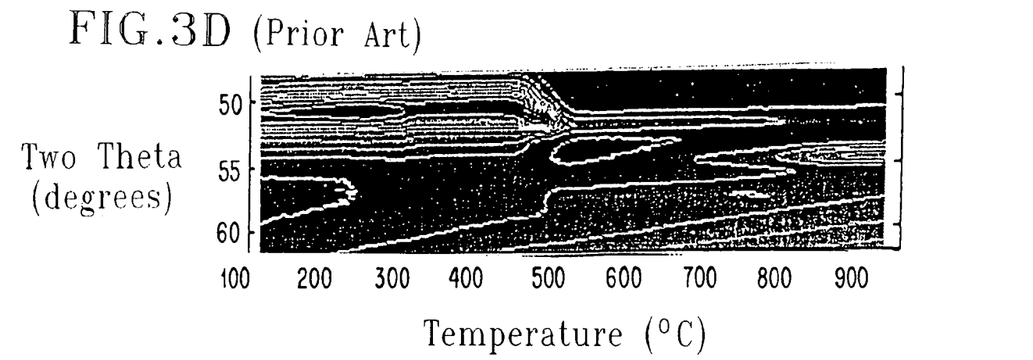
Figure 3E:
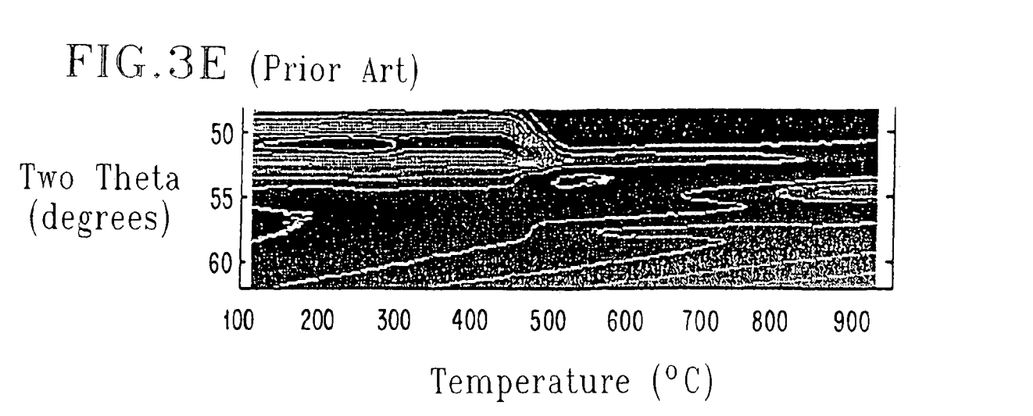

In view of classical nucleation theory, it may be expected that the nucleation of cobalt disilicide on a single crystalline SiGe containing substrate will be even more difficult. This is illustrated in FIGS. 3A-3E; these figures show the formation temperature of cobalt disilicide on different substrates. Specifically, FIG. 3A shows the cobalt disilicide formation temperature for 8 nm Co/silicon-on-insulator (SOI); FIG. 3B shows the cobalt disilicide formation temperature for 8 nm Co/30 nm Si/$Si_{90}Ge_{10}$/SOI; FIG. 3C shows the cobalt disilicide formation temperature for 8 nm Co/30 nm Si/$Si_{80}Ge_{20}$/SOI; FIG. 3D shows the cobalt disilicide formation temperature for 8 nm Co/30 nm Si/$Si_{70}Ge_{30}$/SOI; and FIG. 3D shows the cobalt disilicide formation temperature for 8 nm Co/30 nm Si/$Si_{60}Ge_{40}$/SOI. Clearly the higher the percentage of Ge in the substrate the higher the $CoSi_2$ formation temperature hence the more difficult the nucleation.

In view of the above, there is a need for providing a method for forming cobalt disilicide contacts on top of a SiGe containing substrate which significantly reduces the silicide formation temperature to a value that is compatible with existing complementary metal oxide semiconductor (CMOS) processing schemes.

SUMMARY OF THE INVENTION

The present invention provides a method that solves the increased nucleation temperature that is exhibited during the formation of cobalt disilicides in the presence of Ge atoms. In particular, the present invention provides a method for significantly reducing the formation temperature of cobalt disilicide on SiGe containing substrates. Specifically, the reduction in silicide formation temperature is achieved in the present invention by the steps of:

providing a structure including a Co layer comprising at least Ni on top of a SiGe containing substrate; and subjecting the structure to a self-aligned silicide process that is capable of forming a solid solution of (Co, Ni) disilicide on said SiGe containing substrate, whereby said Ni reduces the formation temperature of the disilicide as compared to a Co layer not containing said Ni.

The self-aligned silicide process that is employed in the present invention comprises three steps, e.g., two annealing steps and a selective etch which is performed between the two annealing steps. The first annealing step is performed at a first temperature that is capable of forming a high resistance cobalt-nickel silicide phase. The high resistance silicide phase is formed by reaction of the Co layer including at least Ni with Si that is present in the SiGe containing substrate. The selective etch removes any unreacted metal, i.e., Co and Ni, from the structure and the second anneal is performed at a second temperature which converts the high resistance silicide into (Co, Ni) disilicide, i.e., (Co, Ni) $Si_2$. The (Co, Ni) disilicide has a resistance that is lower than the silicide formed during the first annealing step.

In some embodiments of the present invention, an optional diffusion barrier layer can be formed on top of the Co layer prior to the first annealing step. The optional diffusion barrier is removed during the selective etch and is therefore not present in the final structure.

The Co layer comprising at least Ni can comprise an alloy layer of Co and Ni, a stack of Ni/Co or a stack of Co/Ni. The term "SiGe containing substrate" as used throughout the present application denotes a single crystalline SiGe containing semiconductor in the source/drain region, or a poly-SiGe layer on the gate of a CMOS device.

The present invention also provides a semiconductor structure that is fabricated using the method of the present invention. Specifically, the inventive semiconductor structure comprises:

a SiGe containing substrate; and a solid solution of (Co, Ni) disilicide on said SiGe containing substrate.

The interface between the (Co, Ni) $Si_2$ and the SiGe containing substrate is smoother compared to a $CoSi_2$ interface. The nucleation controlled formation of $CoSi_2$ tends to cause a rough "scalloped" silicide substrate interface.

DETAILED DESCRIPTION OF THE INVENTION

The present invention, which provides a method for reducing the silicide formation temperature on a SiGe containing substrate and the semiconductor structures containing the silicide as a contact, will now be described in greater detail by referring to the drawings that accompany the present application. In the accompanying drawings, like and/or corresponding elements are referred to by like reference numerals.

Figure 4A:
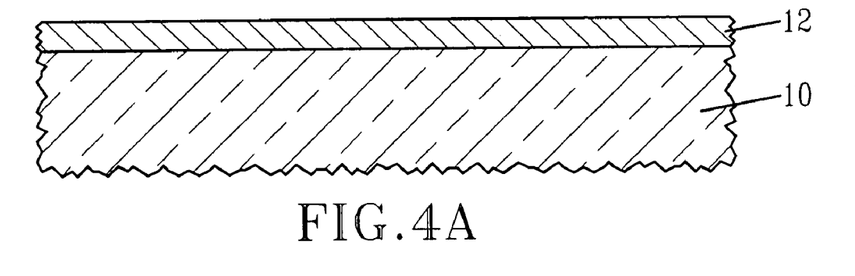
FIGS. 4A-4D are pictorial representations (through cross sectional views) illustrating the basic processing steps of the present invention for reducing the $CoSi_2$ formation temperature on a SiGe containing substrate in the presence of a Co—Ni alloy.

FIG. 4A shows the first step of the present invention in which a Co layer 12 comprising at least Ni is formed on top of a SiGe containing substrate 10. The substrate 10 can be a single crystalline SiGe containing semiconductor material or a polycrystalline SiGe-containing material. The single crystalline SiGe containing semiconductor material is typically the region of a CMOS device in which the source/drain diffusions will be formed. The polycrystalline SiGe-containing material (polySi containing Ge) is typically part of the gate of the CMOS device. The term "SiGe containing" as used herein denotes a SiGe alloy, SiGeC, a SiGe alloy-on-insulator (SGOI), a SiGeC-on-insulator (SGCOI), Si-on-SiGe and the like. When the substrate 10 is a SiGe alloy, the SiGe alloy may include up to 99.99 atomic % Ge. More preferably, the SiGe alloy comprises from about 0.1 to about 50% Ge and from about 50 to about 99.9% Si.

The SiGe containing substrate 10 is fabricated using methods that are well known to those skilled in the art. For example, the single crystalline SiGe containing substrates may be formed by epitaxial growth or wafer bonding, while the polycrystalline SiGe substrates can be formed by thermal mixing or wafer bonding. The thickness of the SiGe containing substrate 10 is inconsequential to the present invention.

The Co layer 12 including at least Ni is formed atop the SiGe containing substrate 10 using a deposition process such as, for example, chemical vapor deposition (CVD), plasma-assisted chemical vapor deposition, evaporation, sputtering, atomic layer deposition (ALD) and other like deposition processes. Sputtering is a particularly preferred method of forming the Co layer 12 atop the SiGe containing substrate 10. The Co layer 12 that includes Ni may be a Co—Ni alloy, a bilayer or multilayered stack of Co/Ni or a bilayer or multilayered stack of Ni/Co.

Notwithstanding the type of Co layer 12 including Ni that is employed in the present invention, the amount of Ni present in the Co layer 12 which imparts the reduction of silicide formation temperature is from about 0.1 to about 40 atomic percent, with an amount of Ni from about 5 to about 30 atomic percent being more highly preferred. The thickness of the Co layer 12 that includes Ni is typically from about 4 to about 15 nm, with a thickness of from about 6 to about 9 nm being more typical. The thickness of the Co layer 12 may be different from the foregoing ranges, which are provided for illustrative purposes only.

In addition to Ni, the Co layer 12 may include other additives including, for example, C, Al, Si, Sc, Ti, V, Cr, Mn, Fe, Cu, Y, Zr, Nb, Rh, In, Sn, La, Hf, Ta, W, Re, Pt, Ce, Pt, Nd, Sm, Eu, Gd, Tb, Dy, So, Er, Tm, Yb, Lu and mixtures thereof. Of the above mentioned additives, Ti, V, Cr, Zr, Nb, In, Sn, Hf, Ta, W, Re and Pt are particularly preferred.

When present, the other additives can be used as an alloy element with a Ni—Co alloy, or they may be part of a multilayered stack, either with the Ni or Co layers mentioned above or as a separate and distinct layer. The amount of the other additive present in the Co layer 12 may vary depending upon the desired use of the other additive. Typically, however, the other additive is present in an amount of from about 0.1 to about 40 atomic percent, with an amount of from about 0.1 to about 20 atomic percent being more typical.

Figure 4B:
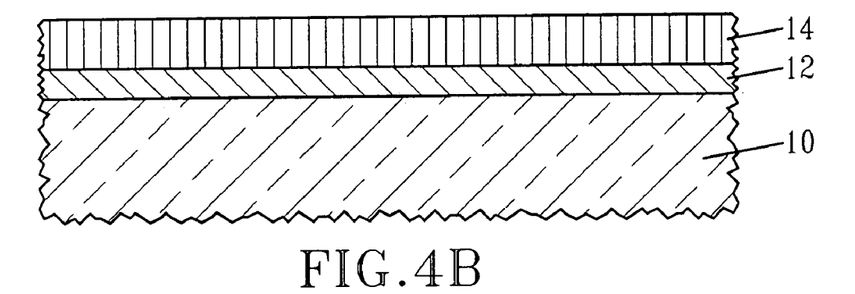

As shown, for example, in FIG. 4B, an optional diffusion barrier 14 may be formed on the surface of Co layer 12. The optional diffusion barrier 14 comprises conventional barrier materials such as, for example, TiN, W, WN, Ti, and other like materials that are capable of being selectively etched as compared with the high resistance silicide formed during the first annealing step of the self aligned silicide process. Optional diffusion barrier 14 is formed using a conventional deposition process that is well known to those skilled in the art. Illustrative examples of suitable deposition processes that can be used in forming the optional diffusion barrier 14 include, but are not limited to: chemical vapor deposition, plasma-assisted chemical vapor deposition, sputtering, evaporation, plating, and atomic layer deposition.

The optional diffusion barrier layer 14 is employed in the present invention as an oxygen diffusion barrier layer between an external ambient gas and the Co layer 12. The thickness of the optional diffusion barrier layer 14 is not critical to the present invention so long as the optional diffusion barrier is capable of preventing oxygen from diffusing into the structure. Typically, the optional diffusion barrier layer 14 has a thickness of from about 5 to about 30 µm. Although the drawings depict the presence of the optional diffusion barrier layer 14, the inventive method works in the absence of the same.

Figure 4C:
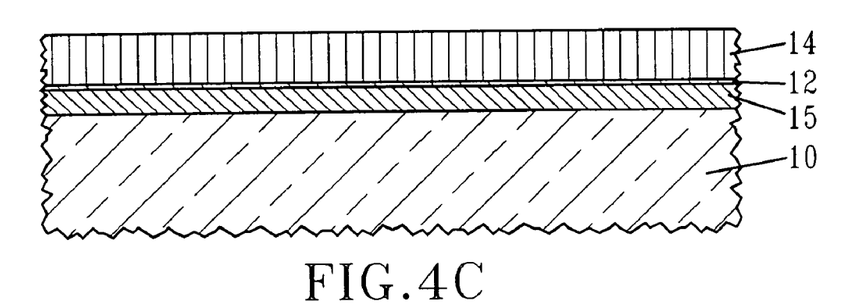
Figure 4D:
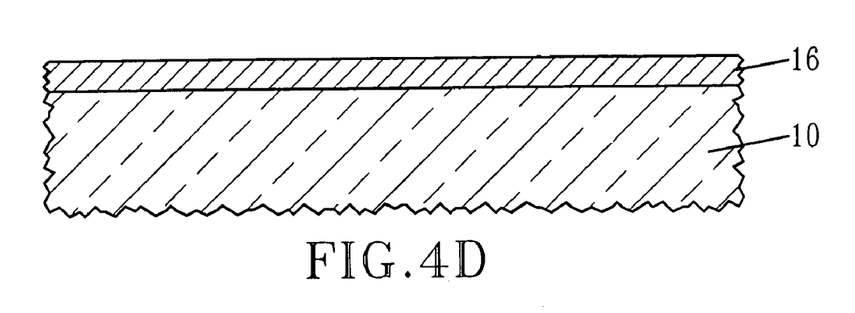

Next the structure shown in FIG. 4B (or 4A, if no optional diffusion barrier is present) is subjected to a self-aligned silicide process that is capable of converting the Co layer 12 into a cobalt disilicide layer 16, which comprises a solid solution of (Co, Ni) disilicide on the SiGe containing substrate 10. The conversion into a solid solution of (Co, Ni) disilicide includes first forming a high resistance Co—Ni silicide phase material. The structure including the high resistance silicide phase formed in the first annealing step of the self-aligned silicide process of the present invention is shown in FIG. 4C. Reference numeral 15 is used to denote the high resistance silicide phase material; note some unreacted metal from layer 12 may remain as shown in FIG. 4C. The unreacted metal is located atop of the high resistance silicide phase material 15. When the optional diffusion barrier is present, the unreacted metal from layer 12 is located between layers 15 and 14, as shown in FIG. 4C. FIG. 4D shows the resultant structure after the selective etch and the second annealing step. In that drawing, reference numeral 16 denotes the solid solution of (Co, Ni) disilicide.

The presence of Ni in the structure reduces the formation temperature of the disilicide to a temperature that is lower than the formation temperature when the Co layer does not contain Ni. The self-aligned silicide (salicide) process used for the formation of the (Co,Ni) disilicide includes the following steps: First, a lower temperature anneal is employed for the formation of a higher resistance silicide, i.e., layer 15; a selective etch is then employed to remove unreacted metal from regions not in contact with the SiGe substrate 10; and then a higher temperature anneal is employed to form the (Co, Ni) $Si_2$ layer 16. Ni is believed to lower the cobalt disilicide formation temperature by up to 120° C.

The amount of Ni present in the disilicide layer 16 is dependent on the amount of Ni initially employed. Typically, the resultant cobalt disilicide 16 contains 0.03 to about 15 atomic percent Ni, with an amount of Ni of from about 2 to about 10 atomic percent being more typical. The Ni is uniformally distributed in the cobalt disilicide layer and a smooth, continuous interface is formed between the (Co, Ni) $Si_2$ layer 16 and the SiGe containing substrate 10.

The first and second annealing steps of the self-aligned silicide process employed in the present invention are typically carried out using a rapid thermal annealing (RTA) process. Moreover, the annealing steps are carried out in a gas atmosphere, e.g., He, Ar, $N_2$ or forming gas. The annealing steps may use different atmospheres or both annealing steps may be carried out in the same atmosphere. For example, He may be used in both annealing steps, or He can be used in the first annealing step and a forming gas may be used in the second annealing step.

Typically, the first annealing step which forms the high resistance silicide phase material 15 is performed at a temperature of from about 400° to about 600° C. for a time period from about 1 to about 90 seconds using a continuous heating regime or various ramp and soak heating cycles. More preferably, the first annealing step is performed at a temperature of from about 450° to about 550° C. for a time period from about 30 to about 90 seconds. The second annealing step is performed at a temperature of from about 600° C. to about 800° C. for a time period from about 1 to about 90 seconds using a continuous heating regime or various ramp and soak heating cycles. More preferably, the second annealing step is performed at a temperature of from about 650° C. to about 750° C. for a time period from about 15 to about 60 seconds.

Other temperatures, times and annealing techniques such as, for example, furnace annealing, spike annealing, and vacuum annealing are also contemplated herein as long as the annealing technique and conditions chosen are capable of converting the Co layer 12 into the a high resistance silicide layer and then into the disilicide layer 16. It is again emphasized that the presence of Ni lowers the disilicide formation temperature to a value lower than that if the disilicide layer was formed from a Co layer not containing Ni. For a Co layer not containing Ni, the disilicide formation temperature is typically from about 600° to about 900° C.

The annealing rates employed in the present invention may vary and are not believed to be critical to the present invention. Typically, however, the annealing rates employed in the present invention are from about 1 to about 150° C./sec, with annealing rates from about 25 to about 75° C./sec being more typical.

As stated above, any non-reacted metal as well as the optional diffusion barrier layer 14 is removed from the structure before the (Co, Ni) disilicide layer 16 is formed. The unreacted metal from layer 12 and the optional diffusion barrier layer are removed from the structure utilizing a selective etching process which selectively removes metal as compared with silicide. For example, any wet etch process may be used in removing the non-reacted metal and the optional diffusion barrier 14 from the structure. A suitable etchant that can be employed in the present invention in the selective etching step that removes both the unreacted metal and the optional diffusion barrier is a mixture of hydrogen peroxide and nitric or sulfuric acid. Other chemical etchants are also contemplated herein.

The method of the present invention substantially reduces the problem of increased silicide nucleation temperature, which is typically observed in the presence of Ge atoms. A reduction of up to 120° C. in silicide formation temperature can be achieved in the present invention. This is achieved by introducing Ni into the solid-state reaction.

The increase of the formation temperature above that of pure $CoSi_2$ on poly-Si (at approximately 600° C.) can be explained by classical nucleation theory, in which the immiscibility of Ge in $CoSi_2$ raises the nucleation barrier for $CoSi_2$ on SiGe containing substrates pushing the formation to higher temperatures. Since the Ge can be in solution with CoSi (the first Co silicide phase to form during the first anneal of the salicide process) but not in solution with $CoSi_2$ the Ge will need to be expelled from the $CoSi_2$ grains requiring additional energy hence higher formation temperatures. The addition of Ni to the Co reduces the nucleation barrier and thus the formation temperature of the (Co, Ni) $Si_2$ solid solution. The reaction shifts from a nucleation controlled mechanism to a diffusion controlled mechanism reducing the temperature of formation.

When an additional additive is used in the initial Co layer 12, the resultant (Co, Ni) disilicide layer 16 would also include the additional additive therein. In such instances, the amount of additional additive is dependent on the amount of initial additive employed. Typically, from about 0.03 to about 15 atomic percent of additional additive can be present in the (Co, Ni) disilicide layer 16.

Figure 5:
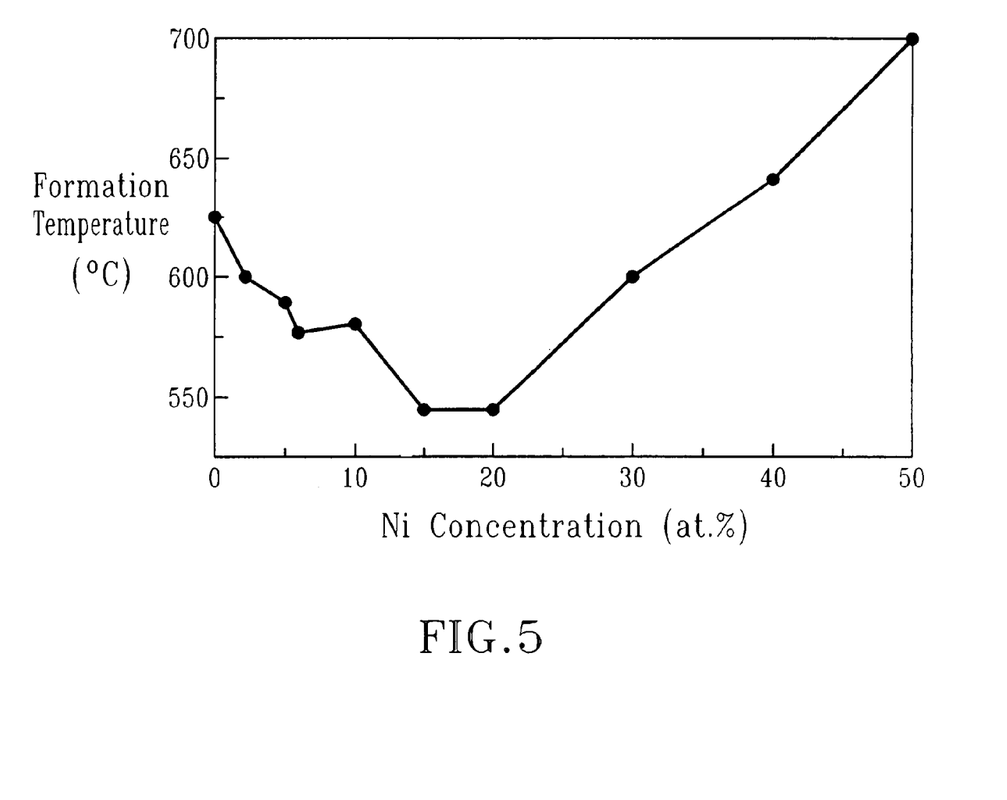
FIG. 5 shows a plot of $CoSi_2$ formation temperature as a function of Ni content in the initial Co—Ni alloy. Concentrations of Ni up to approximately 40 atomic % lead to a lower (Co, Ni) $Si_2$ formation temperature.

FIG. 5 is a graph plotting formation temperature (° C.) vs Ni concentration (atomic percent) present in the Co layer 12. As shown, a reduction in cobalt disilicide formation temperature is obtainable when a Co layer 12 containing up to about 40 atomic percent Ni is employed.

The following example is given to illustrate the present invention and to demonstrate some advantages that can arise from utilizing the same.

EXAMPLE

In this example, the silicide formation temperature of cobalt disilicide formed by annealing a structure including pure Co located atop an n-doped poly-SiGe substrate (prior art) was compared to the silicide formation temperature of cobalt disilcide formed by the method of the present invention. In particular, the inventive sample was prepared by annealing a structure including Co containing 20 atomic % Ni located atop an n-doped poly-SiGe substrate. In each experiment, the n-doped poly-SiGe substrate was formed by ion implantation. The n-type dopant was phosphorous and the concentration of the dopant within each poly-SiGe substrate can be between $1\times10^{14}$ and $1\times10^{16}$ atoms/cm$^2$.

In the prior art sample, a Co layer having a thickness of about 8 nm was sputtered deposited atop the n-doped poly-SiGe substrate. With respect to the inventive sample, the alloy layer of Co containing 20 atomic % Ni (8 nm) was deposited by sputtering onto the n-doped poly-SiGe substrate.

Each sample was annealed using the same annealing protocol, which included the following heating cycle: a constant temperature ramp rate of 3° C./s from 100° C. to 900° C. in a helium containing ambient.

Figure 6A:
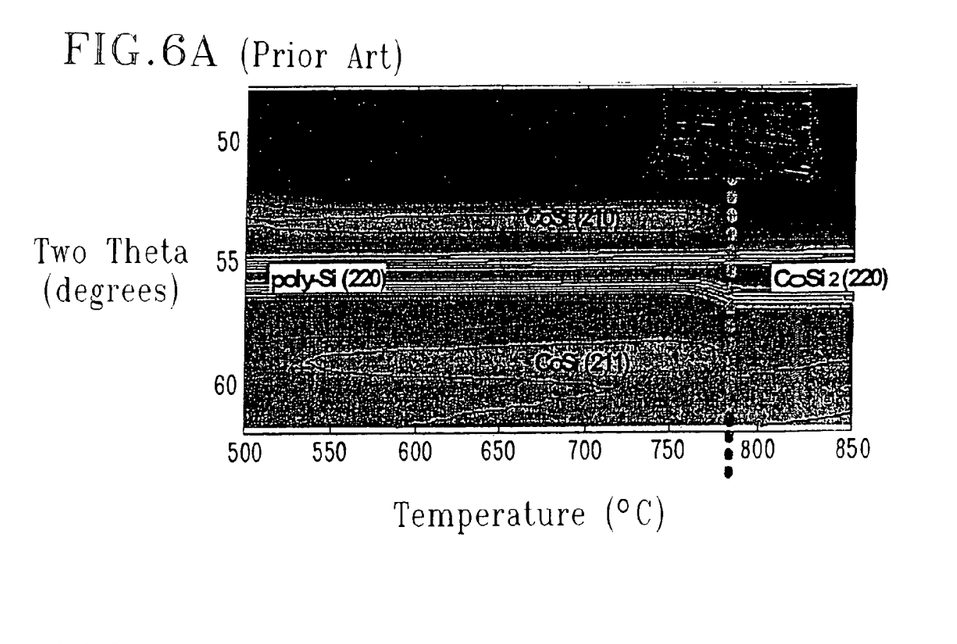
FIGS. 6A-6B are X-ray diffraction graphs showing the $CoSi_2$ formation temperatures for (6A) prior art sample fabricated by annealing a structure containing a pure Co layer atop an n-doped poly-SiGe substrate; and (6B) an inventive sample fabricated by annealing a structure containing an alloy of Co containing 20 atomic % Ni atop an n-doped poly-SiGe substrate.
Figure 6B:
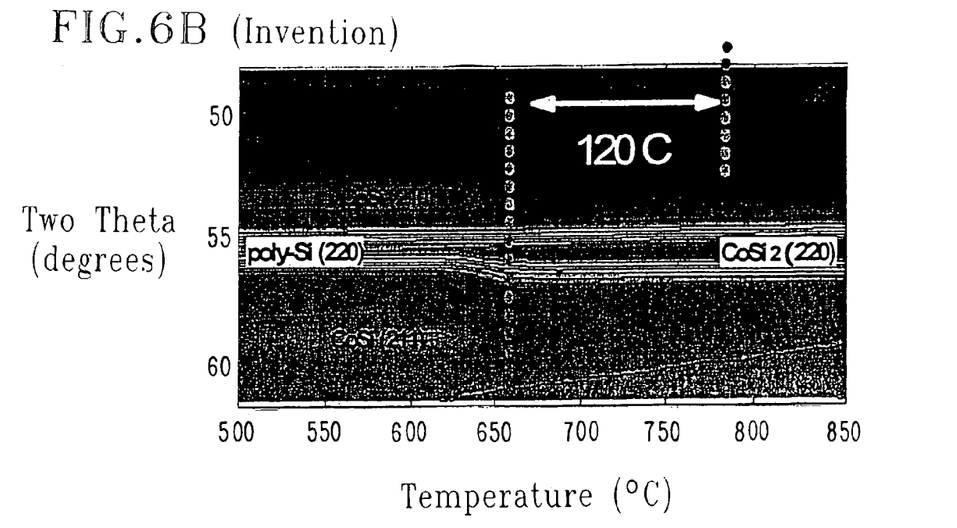

The X-ray diffraction graphs showing the CoSi$_2$ formation temperature for these samples are shown in FIGS. 6A and 6B. FIG. 6A shows the cobalt disilicide formation temperature for the sample made from pure Co. As shown, by the dotted vertical line the cobalt disilicide formation temperature for the prior art sample was 780° C.

FIG. 6B shows the cobalt disilicide formation temperature for the inventive sample. As also shown by the dotted vertical line, the cobalt disilicide formation temperature for the inventive sample was 660° C.

The data in this example clearly illustrates that the method of the present invention provides a means for reducing the silicide formation temperature on a SiGe containing substrate. In this particular example, the silicide formation temperature was reduced by 120° C. by introducing 20 atomic % Ni into the Co layer.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a silicide on a surface of a SiGe containing substrate comprising:

providing a structure including a Co layer comprising at least Ni on top of the SiGe containing substrate, said Ni is present in said Co layer in a content of up to 40 atomic %; and subjecting the structure to a self-aligned silicide process to form a solid solution of (Co, Ni) disilicide on said SiGe containing substrate, wherein said Ni provides a reduction of up to 120° C. in the formation temperature of the disilicide as compared to a Co layer not containing said Ni, an interface is formed between said disilicide and said SiGe containing substrate that is smoother than a CoSi$_2$ interface and Ge is expelled from said (Co, Ni) disilicide.

2. The method of claim 1 wherein the self-aligned silicide process comprises a first anneal performed at a first temperature that is capable of forming a high resistance silicide phase material; a selective etch to remove an unreacted metal from regions not in contact with the SiGe containing substrate; and a second anneal performed at a second temperature that is higher than the first temperature of the first anneal.

3. The method of claim 2 wherein the first anneal is performed at a temperature of from about 400° to about 600° C. for a time period from about 1 to about 90 seconds using a continuous heating regime or various ramp and soak heating cycles.

4. The method of claim 2 wherein the second anneal is performed at a temperature of from about 600° C. to about 800° C. for a time period from about 1 to about 90 seconds using a continuous heating regime or various ramp and soak heating cycles.

5. The method of claim 1 wherein the Co layer comprising at least Ni contains from about 0.1 to about 40 atomic percent Ni.

6. The method of claim 5 wherein the Co layer comprising at least Ni contains from about 5 to about 30 atomic percent Ni.

7. The method of claim 1 wherein the Co layer comprising at least Ni is a Co—Ni alloy or a multilayered stack comprised of Co/Ni or Ni/Co.

8. The method of claim 1 wherein the Co layer comprising at least Ni further comprises an additive selected from the group consisting of C, Al, Si, Sc, Ti, V, Cr, Mn, Fe, Cu, Y, Zr, Nb, Rh, In, Sn, La, Hf, Ta, W, Re, Pt, Ce, Pr, Nd, Sm, Eu, Gd, Tb, Dy, So, Er, Tm, Yb, Lu and mixtures thereof.

9. The method of claim 8 wherein the additive is Ti, V, Cr, Zr, Nb, In, Sn, Hf Ta, W, Re or Pt.

10. The method of claim 8 wherein said additive is present in said Co layer comprising at least Ni in an amount of from about 0.1 to about 40 atomic percent.

11. The method of claim 2 wherein said first and second anneals comprise a rapid thermal annealing (RTA) process.

12. The method of claim 2 wherein said first and second anneals are each carried out in an inert, nitrogen or forming gas atmosphere.

13. The method of claim 2 wherein the first and second anneals are each performed at a rate from about 25 to about 75° C./sec.

14. The method of claim 1 wherein a diffusion barrier is formed atop the Co layer comprising at least Ni prior to said self-aligned silicide process.

15. The method of claim 14 wherein the diffusion barrier comprises TiN, W, WN, or Ti.

16. The method of claim 14 wherein the diffusion barrier is removed by a selective etching step of said self-aligned silicide process.

17. A method fabricating a silicide on a surface of a SiGe containing substrate comprising:
provproviding a structure including a Co layer comprising at least Ni on top of the SiGe containing substrate, said Ni is present in said Co layer in a content of up to 40 atomic %;
performing a first anneal at a first temperature that is capable of forming a high resistance silicide phase material by reacting said Co layer comprising Ni with Si present in said SiGe containing substrate;
selective etching the structure to remove an unreacted metal from regions not in contact with the SiGe containing substrate; and
performing a second anneal at a second temperature that is higher than the first temperature of the first anneal, said second anneal converts the high resistance silicide phase material into a solid solution of (Co, Ni) disilicide, wherein the first and second anneal are carried out using a rapid thermal annealing process in a gas atmosphere containing at least one gas selected from the group consisting of He, Ar, $N_2$ and forming gas, and wherein said Ni provides a reduction of up to 120° C. in the formation temperature of the disilicide as compared to a Co layer not containing said Ni, an interface is formed between said disilicide and said SiGe containing substrate that is smoother than a $CoSi_2$ interface and Ge is expelled from said (Co, Ni) disilicide.

18. A method of fabricating a silicide on a surface of a SiGe containing substrate comprising:
providing a structure including a Co layer comprising at least Ni on top of the SiGe containing substrate, said Ni is present in said Co layer in a content of up to 40 atomic %, and wherein said Co layer including at least Ni further comprises from about 0.1 to about 40 atomic percent of an additive selected from the group consisting of C, Al, Si, Sc, Ti, V, Cr, Mn, Fe, Cu, Y, Zr, Nb, Rh, In, Sn, La, Hf, Ta, W, Pt, Ce, Pr, Nd, Sm, Eu, Gd, Tb, Dy, So, Er, Tm, Yb Lu and mixtures thereof; and
subjecting the structure to a self-aligned silicide process to form a solid solution of (Co, Ni) disilicide on said SiGe containing substrate, wherein said Ni provides a reduction of up to 120° C. in the formation temperature of the disilicide as compared to a Co layer not containing said Ni, an interface is formed between said disilicide and said SiGe containing substrate that is smoother than a $CoSi_2$ interface and Ge is expelled from said (Co, Ni) disilicide.

* * * * *